United States Patent
Covert et al.

(10) Patent No.: US 6,830,627 B1
(45) Date of Patent: Dec. 14, 2004

(54) COPPER CLEANING COMPOSITIONS, PROCESSES AND PRODUCTS DERIVED THEREFROM

(75) Inventors: Kathleen L. Covert, deceased, late of Binghamton, NY (US); by Kelly Hawley, legal representative, Binghamton, NY (US); John M. Lauffer, Waverly, NY (US); Peter A. Moschak, Chenango Forks, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/274,935

(22) Filed: Mar. 23, 1999

(51) Int. Cl.⁷ .............................. B08B 7/00; B08B 3/00
(52) U.S. Cl. .................................. 134/3; 134/2; 134/41
(58) Field of Search .................................. 134/2, 3, 41

(56) References Cited

U.S. PATENT DOCUMENTS

| | | | |
|---|---|---|---|
| 3,269,881 A | | 8/1966 | Alderuccio et al. |
| 3,645,772 A | | 2/1972 | Jones |
| 4,130,455 A | | 12/1978 | Elias et al. |
| 4,144,119 A | * | 3/1979 | Dutkewych et al. |
| 4,238,279 A | * | 12/1980 | Tsubai et al. |
| 4,378,270 A | | 3/1983 | Brasch |
| 4,631,117 A | * | 12/1986 | Minten et al. ............... 205/126 |
| 4,695,348 A | | 9/1987 | Battey et al. |
| 4,774,491 A | * | 9/1988 | Vugts .......................... 338/306 |
| 4,981,553 A | | 1/1991 | Tytgat et al. |
| 5,550,006 A | * | 8/1996 | Larson et al. ............... 430/311 |
| 5,855,805 A | * | 1/1999 | Arabinick |
| 5,885,476 A | * | 3/1999 | Hong et al. ................. 252/79.2 |
| 6,020,029 A | * | 2/2000 | Ferrier et al. ................ 427/333 |
| 6,156,221 A | * | 12/2000 | Lauffer et al. ............... 216/105 |
| 6,281,090 B1 | * | 8/2001 | Kukanskis et al. .......... 438/382 |

FOREIGN PATENT DOCUMENTS

JP 5-148658 * 6/1993

OTHER PUBLICATIONS

U.S. patent application Ser. No. 09/654,963, Covert et al.

* cited by examiner

*Primary Examiner*—Alexander Markoff
(74) *Attorney, Agent, or Firm*—Mark Levy & Associates; Lawrence R. Fraley

(57) ABSTRACT

The present invention is a persulfate microetchant composition especially useful for removing impurities from copper surfaces during fabrication of microelectronic packages. The microetchant formulation is characterized by its ability to selectively clean copper in the presence of nickel, nickel-phosphorous and noble metal alloys therefrom. Furthermore, no deleterious galvanic etching occurs in this microetchant-substrate system so that substantially no undercutting of the copper occurs. The combination of high selectivity and no undercutting allows for a simplification of the microelectronic fabrication process and significant improvements in the design features of the microelectronic package, in particular higher density circuits. The persulfate microetchant composition is stabilized with acid and phosphate salts to provide a process that is stable, fast acting, environmentally acceptable, has high capacity, and can be performed at room temperature. A preferred etchant composition is 100 gm/liter sodium persulfate, 3 volume % phosphoric acid and 0.058 molar sodium phosphate dibasic.

20 Claims, No Drawings

COPPER CLEANING COMPOSITIONS, PROCESSES AND PRODUCTS DERIVED THEREFROM

FIELD OF THE INVENTION

This invention pertains generally to compositions and processes for cleaning copper or copper alloy (hereinafter collectively referred to as copper) surfaces during the fabrication of microelectronic packages and, more particularly, to selective copper microetching at the interface or in the vicinity of noble metals and their alloys typically found at plated edge connectors, contact pads, plated through holes (PTH), and embedded resistors.

As is known in the art, there is a trend to reduce the size of microelectronic packages. This results in "dense" microelectronic packages having finer and thinner printed circuit lines, smaller diameter plated through holes, and more multilayering. One problem with making dense printed circuit boards is that the yield from the manufacture of these boards is relatively low due to such problems as poor adhesion of layers in packages, shorting or bridging caused by contaminants, and open circuits due to breaking of the microcircuit lines typically caused by harsh cleaning or galvanic etching. It has therefore become a more difficult problem since cleaning of the microelectronic packages must be performed during their manufacture, yet precise conditions must be maintained otherwise the fragile microcircuits will be irrevocably damaged during such cleaning processes.

BACKGROUND OF THE INVENTION

At the present time, cleaning of copper on microelectronic substrates is performed either by chemical means, mechanical means or a combination of both. Contaminants present during printed wiring board (PWB) manufacture include photoresist materials, residual organic and residual metallic contaminants such as alkali metals and native/metallic oxides. Metallic films comprising metal oxides and metal halides are also inadvertently deposited onto electronic packages during immersion into etchant or resist stripper baths. If mechanical means have been used for cleaning, there is the possibility that residues of abrasive particles, such as pumice, will be adsorbed on the surface of the copper.

This cleaning process also called "microetching or soft etching" is ideally designed to exclusively clean the surface of the copper without diminishing or changing the dimensions of the copper itself or attacking adjacent materials (i.e., there is complete selectivity for eliminating surface contaminants on the copper and no bulk erosion or attack of the electrical microcomponents). The benefit of such idealized cleaning is to provide microelectronic packages with reduced rates of malfunction or failure due to delamination, shorting or open circuits.

For example, it is known that corrosive chlorides can be deposited on microelectronic packages causing weakening or embrittlement of electrical connectors as well as delaminate the layers of the package resulting in current leakages or physical failure. As miniaturization of microelectronic packaging is an important target, the problem of obtaining high levels of selectivity has been exacerbated due to the fragility of microcomponents such as fine-line copper circuits. Compounding the problem of finding an ideal microetching process is the desire to provide a manufacturing process that is fast and efficient. However, typically the faster the cleaning process the lower the selectivity which can ultimately be achieved. This is well known in the art of copper polishing where it is preferred that mild chemical polishing agents are used at longer processing times in order to minimize the loss of bulk copper. It is also recognized that although numerous chemical copper-etchant compositions are known in the art of microelectronic package manufacture they cannot indescriminantly be used in this application since they, by definition, will erode the bulk of the copper. Such etchants include copper or ferric chlorides, chromium salts, alkaline-ammonia, hydrogen peroxide-sulfuric acid or nitric acid compositions, and persulfate salts. Each of these compositions has certain limitations and disadvantages as described hereinbelow.

The metal etchants, in particular the chromium salts, create a deleterious environmental impact. It is also known that chromium salts are human carcinogens; therefore, their use and disposal are especially problematic.

Nitric acid, either alone or in combination with sulfuric acid or copper nitrate, has been reported by Brittey (U.S. Pat. No. 4,695,348) to be useful for etching copper in wiring boards. However, nitrogous oxide gas is a byproduct of this process.

The alkaline-ammonia compositions are used commercially because they are relatively fast, have substantial copper-carrying capacity and are reasonably tolerant of some metal resists and some dry film resists. However, these same compositions have poor selectivity for copper versus other metals and alloys. Significant process control is required to achieve acceptable selectivity. It is also known that these compositions may not work well with fine line copper geometries. Furthermore, the dissolved copper is difficult to recover. Also, fumes from the ammonia composition present worker exposure concerns.

The hydrogen peroxide-sulfuric acid compositions, generating permonosulfuric acid, used in copper etching processes are very clean to operate and can be recycled. However, these same compositions have relatively slow etching rates and require substantial cooling for stability control due to the autodecomposition reaction of the hydrogen peroxide. Additionally, both the performance of the process and the decomposition of the peroxide are very sensitive to trace impurities via homo- or heterocatalysis. Stabilizers are necessary for peak performance but these are metal specific. Brasch (U.S. Pat. No. 4,378,270) teaches phenol-sulfonic acid for copper containing solutions. It is also known from Alderuccio, et al (U.S. Pat. No. 3,269,881) that these compositions are adversely affected by chloride or bromide ion at levels of 2 mg/liter, causing reduced etch rates. Elias (U.S. Pat. No. 4,130,455) teaches that the addition of sodium or potassium thiosulfate can counteract this effect.

But use of these additives does not address the basic problem of the catalytic decomposition of the peroxide discussed hereinabove. This decomposition has two important implications: firstly, the depletion of the peroxide in the etchant solution reduces the etchant rate; and secondly, there is potential for uncontrolled decomposition of large volumes of high temperature solutions, generating high concentrations of oxygen and increasing the safety risks therefrom. Because decomposition of the peroxide is accelerated at elevated temperatures, processing temperatures must be kept low. This adversely affects the rate of the etching process and exacerbates the already low copper-carrying capacity of the peroxide-sulfuric acid composition.

Another problem associated with using aqueous acidic solutions of hydrogen peroxide for microetching is that it typically requires a two step process. After the treatment step, a further step with diluted sulfuric acid or diluted hydrochloric acid is required due to formation of oxide films on the copper surface.

Tytgat and Magnus report in U.S. Pat. No. 4,981,553 that a combination of hydrogen peroxide, chloride ions, phosphoric acid, and phosphate and hydrogenphosphate ions, in quantities to impart a pH of 1.25 to 3, may be used as a copper polishing formulation not requiring excess working temperatures or intense mechanical agitation, however; the process under these conditions is designed to take one or more hours to obtain adequate results. Tytgat et al report that the chloride ion is added for the purpose of protecting the metal against uncontrolled local corrosion and the phosphate ions are added to maintain the desired pH range (i.e., it is added as a buffer). There is no mention or indication that the phosphate ions can function to inhibit etching of other metals in the vicinity of the copper, nor is there teaching that other oxidants can be used in this invention.

Heretofore salts of persulfate have been utilized for microetching purposes. Ammonium persulfate, however, is defective in that copper ammonium complex is formed during neutralization making it difficult to remove copper from the wastewater effluent. Prior art studies indicate that sodium persulfate is inferior to ammonium persulfate as a microetchant and furthermore has a short life.

Another problem typically encountered with chemical microetching and etching formulations is the tendency for accelerated microetching of copper to occur in regions adjacent to, or in the vicinity of, precious metal, noble or more inert metals such as gold or palladium and their alloys or nickel and its alloys especially nickel/phosphorous. This effect known as galvanic etching causes undercutting especially of fine line copper circuitry and in worst cases can completely erode the circuit line. Examples of microelectronic packaging where this can occur include printed wiring boards containing plated through holes, edge connectors, etch masks, commoning bars or embedded resistors comprising nickel/phosphorous alloy resistors.

Conventional microetch formulations such as persulfatelsulfuric acid used for cleaning of copper circuits (i.e., printed circuit cards and boards) in the presence of discrete nickel/gold features (i.e., plated contact tabs or edge fingers), or other precious metals can lead to complete etch out of the copper circuit lines due to the galvanic accelerated etch effect associated with these prior art microetchants in the presence of these precious metals. In fact, when multiple microetch cleaning passes are employed it is common to have the copper circuit features completely etched away in as few as 2–3 cleaning passes.

The long-standing problem of galvanic etching has limited the designs and capabilities of the microelectronic packages and has required additional manufacturing complexity in order to circumvent this problem. For example, one prior art attempt to solve the problem of galvanic etching was to apply a soldermask or protective coating over the interface of the gold plated tabs that were attached to the copper circuit lines. However when the soldermask is brought closer to the gold plated connector, there is a higher probability of causing a plugging problem due to flaking or abrading soldermask.

An example of a limitation in PWB design due to galvanic etching is found during the process of microetching of printed wiring boards using conventional microetchants such as acidic persulfate solutions, undercutting of the nickel/copper interface causes the resultant nickel-clad copper circuit lines to have an uneven cross-section. This defect limits the minimum size of the circuit line and, in doing so, prevents the design of more dense circuits in the printed board package.

Another example of this problem occurs on printed wiring boards having gold plated edge connectors. These gold fingers are typically connected by 0.006" (6 mil) wide copper traces to the rest of the wire board. Prior to shipping the finished wire board, the board is processed through an "ENTEK" process (ENTEK is a trademark of Ethone OMI) consisting of degreaser, prior art sodium persulfate microetch and ENTEK to prepare the copper lands for Surface Mount Technology (SMT) assembly. Boards have frequently been prepared after this "ENTEK" process, in which the copper circuit lines connecting the gold tabs have been completely, or nearly completely, etched through due to galvanic etch effects.

Yet another example of the deleterious effect of prior art microetchants is the degradation of embedded resistor tolerances. Buried or embedded resistors are frequently formed on internal layers of PWB using OHMEGA-PLY Resistor/Conductor Foil. Resistors are formed by selective etching of copper circuit lines and the NiP alloy of the resistors. Precision resistor fabrication requires precise control of resistor dimensions (length, width, and thickness). Good resistor precision and uniformity has been achieved on the etched resistors alone, however, this precision and uniformity is frequently lost as these internal layers with resistors are fabricated into the composite wiring board. The resistor precision is lost while preparing the copper surfaces for laminant bond adhesion using a copper oxide or chlorite process. One example of such a process is the Shipley Chlorite process. The first step in the Shipley Chlorite process is a sodium persulfate/sulfuric acid microetch step. The purpose of this microetch is to remove copper oxides and to provide a roughened or microetched copper surface. The microetch step is critical for achieving adequate inner laminant bond strengths. However, this particular microetch chemistry etches NiP alloys almost as aggressively as it etches copper and thus the NiP resistors are attacked, causing significant increases in resistor value and tolerance.

Mechanical microetching has also been employed in the past but especially with miniaturization the components in the package become more susceptible to physical damage and contamination. This is especially true when pumice is used, it is not uncommon to find retained pieces entrapped in the copper foil or in the case of scrubbing using nylon brushes, find gouges in the foil surfaces. In addition, thinner innerlayer materials are susceptible to other defects and damage from aggressive mechanical surface scrubbing, such as distortion and incomplete treatment of copper surfaces due to worn scrubbers or plugged nozzles. Due to these problems substitution to chemical polishing is highly desirable.

SUMMARY OF THE INVENTION

With consideration of the aforementioned problems of cleaning the copper surfaces of microelectronic packaging, the present invention provides for novel formulations, and processes of manufacture of microelectronic packages, in particular printed wiring boards, having the following advantages:

a) a rapid and reproducible manufacturing process for the removal of particulate or film impurities adsorbed on the surfaces of copper elements on a microelectronic package;

b) printed wiring boards formed having a high density of excellent quality fine line electrical circuits (i.e., uniform line widths) via a high yielding process;

c) printed wiring boards having superior adhesion between copper surfaces and dielectric materials, resins, etchmasks, etch resists, solder resists, photoresists and electroplated and electrolessly plated noble metals, d) a process to selectively clean the surface of copper features in a microelectronic package without causing etching of nickel or nickel phosphorous resistor elements, e) a process to selectively clean the surface of copper features in the proximity of precious metal plated features in a microelectronic package without causing galvanic etching of the bulk copper in the copper features, and f) a stable, environmentally acceptable, and non-hazardous microetchant formulation.

The microelectronic packages fabricated with the use of the inventive formulation may be double sided or be multilayered having inner circuitry layers separated by resin layers and may optionally contain such features as metallized plated through-holes, contact fingers, connecting pads, and planar resistors. The inventive formulations may be used on copper surfaces during the fabrication of printed wiring boards either in the absence of inert metal features, for example to remove oxide coatings on the copper prior to a solder level process or prior to mounting of electronic parts in order to improve solderability, or in the presence of inert metal features, for example to clean the surface of copper tabs after electroplating with Ni/Au. In the former example, the function of the inventive formulation is to improve adhesion of the solder. In the latter example, it is to clean the surface while not causing accelerated etching of the copper feature. The present formulations can be used to improve adhesion between copper surfaces and coating layers of metals, organic resists, dielectric materials, masking materials, or the like. Although not wishing to be bound by theory, it is believed that the current formulation improves adhesion of copper surfaces to solders and other materials by not only cleaning the surface of the copper but also by micro-roughening the surface. This micro-pitting creates a textured surface that provides greater surface area between the two components.

The current invention can be used during intermediary and final steps in the fabrication of microelectronic packages, in particular, printed wiring boards prepared by either the subtractive, semiadditive or additive process.

It is especially desirable to utilize this inventive microetchant process to fabricate high density microcomponents having selectively plated Ni/Au features since there is a greater likelihood of galvanic etching of the copper fine line circuitry occurring during this process.

It is also especially desirable to utilize this inventive microetchant process to fabricate microelectronic packages containing both copper features and nickel or nickel/phosphorus resistors since minimal etching of the nickel or nickel phosphorous resistor is observed.

The invention described herein is a persulfate microetchant composition useful for removing particulate and film forming impurities on the surface of copper features during fabrication of microelectronic packages. The microetchant is especially characterized by its ability to selectively clean the surface of copper in the presence of nickel or nickel-alloys which may themselves be optionally overplated with noble metal alloys. Prior art references differentiate the "cleaning" of a copper surface as removal of the top 1–5 micron of the copper feature compared to "etching" where removal of bulk copper causes gross changes in dimension to the copper feature. This distinction is maintained in the current invention. Furthermore, in the presence of noble or precious metals no deleterious galvanic etching occurs in this etchant-substrate system so that substantially no accelerated etch of the copper features occur. The combination of high selectivity and lack of galvanic etch permits multiple cleaning operations during the intermediary steps of microelectronic fabrication process without significant deterioration of the fine line copper circuitry especially in higher density circuits. The persulfate microetchant composition is stabilized with acid and phosphate salts to provide a process that is stable, fast acting, environmentally acceptable, has high capacity, and can be performed at room temperature. Working microetchant compositions include 25–150 gm/liter sodium persulfate, 0–5% volume % phosphoric acid and 0–0.25 molar sodium phosphate dibasic. Preferred compositions include 50–100 gm/liter sodium persulfate, 1–3% by volume phosphoric acid and 0.05 to 0.15 molar sodium phosphate dibasic.

DETAILED DESCRIPTION OF THE PREFERRED EMBODIMENT

As discussed hereinabove, the invention involves formulating a composition and a process for cleaning or microetching copper or copper alloys. In its most general sense, this inventive process will clean the exposed surfaces of three dimensional copper objects. These objects can be formed by any manufacturing process and include all crystalline forms of copper. If the copper to be cleaned by this inventive composition is a thin film, it may have been formed from preparation of a rolled copper foil, electroless deposition, electrolytic deposition, or sputtering. The copper may be affixed directly to a core substrate such as epoxy-glass resin, polyethyleneterephthalate, polyimide or other known dielectric materials. In a preferred embodiment, the copper is affixed to the substrate via an adhesion promoting layer which is sandwiched between the copper and the substrate. Compositions known in the art to promote adhesion between the copper and the substrate are, for example, palladium alloy seeds.

The microetchant composition has a unique combination of properties. The chemicals that comprise this formulation are readily available and inexpensive. In addition, the formulation has excellent shelf life and does not pose significant environmental or safety problems. The formulation, although designed to specifically microetch copper features selectively in the presence of inert metals, has wide applicability during many stages of the fabrication of microelectronic packages as seen in the examples hereinbelow. These formulations can be used during the fabrication of printed wiring boards prepared by either the well known subtractive, semi-additive or fully additive processes. The formulations of this invention have been unexpectedly found to eliminate galvanic etching of copper features when such copper features are electrically coupled to nickel (Ni) or nickel/gold (Ni/Au) plated features. The microetchant is selective to cleaning copper without etching nickel or its alloys. The formulations also are selective for etching copper in the presence of other metal etch masks such as solder (Sn/Pb).

The microetchant composition of the present invention comprises a mixture of a proton donor, a persulfate salt, and a phosphate salt.

The proton donor materials useful in this invention include the strong and weak oxoacids, examples of which include sulfuric acid, phosphoric acid, phosphorous acid, perchloric acid, perchlorous acid and water soluble organic acids such as acetic acid, carbonic acid and oxalic acid. Also contemplated within the scope of the invention are derivatives of the above acids that readily hydrolyze to these acids under ambient or elevated temperatures, such as ester and anhydride derivatives. Other examples include di- and tri-phosphoric acid, polyphosphoric acid, metaphosphoric acid, cyclotrimetaphosphoric acid. The preferred acid is phosphoric acid. Hydrochloric acid and nitric acid, although useful, are not preferred in the current invention due to toxic byproducts such as nitrogen oxides and chlorine gas.

The persulfate salts, also known in the art as peroxydisulfate salts, can be any of the alkali metal or alkaline metal salts that are of sufficient water solubility to prepare the specified formulations. Ammonium persulfate is also a useful salt in this invention. Preferred salts are potassium and sodium persulfate. The most preferred salt is sodium persulfate.

The phosphate salts useful in this composition include alkali metals such as lithium, sodium and potassium phosphate and quaternary nitrogen salts such as ammonium and water soluble alkaline metal phosphate salts. Because the phosphate salt is tribasic, these salts can be either mono, dibasic or tribasic (e.g., $NaH_2PO_4$, $Na_2HPO$, and $Na_3PO_4$). As known in the art, $Na_3PO_4$ is called sodium orthophosphate and is derived from the reaction of orthophosphoric acid, $H_3PO_4$, and three equivalents of sodium hydroxide. It is also within the scope of the invention to employ water stable polyphosphate salts such as diphosphoric acid tetrabasic, and sodium tripolyphosphate as equivalent to the orthophosphate salts. The preferred salts are potassium and sodium phosphate dibasic. Phosphate salts have been utilized in the prior art as a protectant against corrosion; specifically with regard to steel. Phosphoric acid is also known to be added to etchant solutions on which solder (tin-lead) is employed as an etch resist. But no mention is found for the specific combination of phosphate-containing etchants in the presence of nickel. To the contrary, it has been reported that aerated phosphoric acid will corrode nickel. It is therefore an unexpected benefit that in addition to stabilizing the persulfate salt formulation, complete selectivity for etching copper in the presence of nickel is obtained. Although not wishing to be bound by theory, it is believed that the phosphate salts play several important roles in the process including, acting to buffer and stabilize the inventive microetchant formulation, prevent oxide formation from forming on the fresh copper surfaces and prevent attack by the microetchant on the nickel/phosphorous surfaces.

The initial microetchant composition can comprise a mixture of 20–150 gm/liter persulfate salt, up to 5 volume % of the proton donor and up to approximately 0.116 molar phosphate salt. If no phosphate salt is initially included, the composition will rapidly degrade during use (e.g., during the microetching process). Therefore, phosphate salt must be added during the process by adding a regeneration solution of phosphate to bring the working formulation to the desired phosphate concentration. This concentration has been found to unexpectedly give complete stability to the persulfate formulation without any deleterious side effects.

Adjuvants such as surfactants can also have beneficial effects for the etchant formulation. As examples of the classes of surfactants, anionic surfactants, such as carboxylic acid type, polycarboxylic acid type, naphthalene sulfonic acid type and neutral phosphate type surfactants can be used. Nonionic surfactants and cationic surfactants may also be used depending on conditions of dispersion. Since the pH of the microetchant formulation will be acidic, surfactants of the cationic and anionic type are useful within the scope of the invention. The surfactants range from about 0.001% to about 10% by weight of the formulation, preferably from about 0.01% to 3% by weight. The surfactants alone or in combination, preferably encompass nonionic and anionic surfactants. Examples of nonionic surfactants include without limitation: ethoxylated nonyl and octylphenols of ethylene oxide from 3 to 30 moles of ethylene oxide, and modified polyethoxylated straight chain alcohols as are available under the tradename Triton DF-16 from Rohm & Haas; alkyl polyoxyalkylene ether, (e.g., Mazawet DF from Mazer Chemical) and block copolymers of ethylene oxide and propylene oxide such as Pluronic 31R1 from BASF. Anionic surfactants include without limitation: sulfonated aryl and alkyl hydrocarbon such as Petro BA from Desoto Inc.; sulfated aryl and alkyl hydrocarbons such as Sipon BOS from Alcolac, Inc.; FC-135 anionic fluorochemical surfactant from 3M Corporation, and phosphate esters such as Triton H-66 from Rohm & Haas.

Other useful components that can be optionally added to the inventive formulation or used in a prior or subsequent step include, organosilane plated through hole conditioners, buffers, anti-tarnishing agents such as triazoles and polymers to prevent excessive etching such as polyvinyl pyrrolidinone.

In order to improve the adhesiveness between the surfaces of the copper and resin coatings such as prepregs, it is possible to further treat the surfaces (after treatment with the inventive microetching formulation) with an aqueous solution of azole compound or an alcoholic solution according to U.S. Pat. No. 3,645,772. An oxidizing treatment known in the art as brown oxide or black oxide treatment may also be applied after the inventive microetch application.

Organic solderability preservatives react with all copper surfaces that are exposed to the preservative for the purpose of preserving or enhancing solderability of areas that will later be soldered. A typical solderability preservative is benzotriazole, which complexes with copper to form copper triazoles. These copper triazoles inhibit the formation of copper oxides which could adversely affect solderability.

The microetchant process is preferably performed at room temperature, but can also be performed at higher temperatures if desired, up to 130° F. The persulfate nmicroetchant formulations are preferably applied to the component by spraying, but immersion of the component in the formulation is feasible. The contact time between the copper surfaces and the microetchant solution will vary according to the extent of microetch desired, temperature, and specific formulation, but typically will range from about 10 seconds to 10 minutes and preferably between 30 to 120 seconds.

The microetchant formulations are specifically designed to clean the surface or microetch copper in the presence of nickel, nickel-phosphorous or nickel-phosphorous overcoated with noble metals such as gold and palladium. It is also possible to use this microetchant solution with other metal masks, such as solder (Sn/Pb). However, as noted hereinabove, the present formulation can be used satisfactorily to clean copper features when no inert metallic features are present on the microelectronic component.

The inventive microetchant formulation can be widely used for chemical cleaning and the like for copper or copper alloys. The resulting surfaces of copper have adequate irregularities or "micropitting" with deep concave and convex portions so that they can exhibit excellent adhesion to resins such as prepregs, solder resists, dry film resists, electrodeposited resists and furthermore provides improved solderability. The microetch formulation is, therefore, particularly useful for the manufacture of various PWB, including those for pin grid array (PGA) and ball grid array (BGA), as well as surface treatment of lead frames used for integrated circuit boards.

The dielectric substrates used in the manufacture of the printed wiring boards of this invention can be chosen from a wide range of materials including, ceramics, glass-epoxy, glass cloth reinforced or unreinforced thermoset resins, specifically phenolic resins such as ABS, polyimides such as KAPTAN (a DuPont trademark), polymeric vinyl chloride and TEFLON (a DuPont trademark) and thermosetting and thermoplastic resins such as aromatic polyesters, polyamides, polyacetals, polyarylene sulfides, polyphenyleneoxide, polyimides, polyhaloethylenes, polyether ketones and polyarylates and compositions therefrom. Preferred substrates compositions include polyethyleneterphthalate, polytetrafluoroethylene (Teflon), FR4 epoxy/glass cloth, IBM Driclad epoxy/glass cloth, and BT resins. Where multilayer microelectronic packages are being manufactured by this inventive process, dielectric materials used in the upper strata can also be selected from the abovementioned materials or other dielectric resins known in the art. Therefore, it is considered within the scope of the invention that upper dielectric strata may be composed of the same or different dielectric material as the substrate.

The function and advantage of these and other embodiments of the present invention will be more fully understood from the examples below. The following examples are intended to illustrate the benefits of the present invention, but do not exemplify the full scope of the invention.

WORKING EXAMPLES

Example 1

An example of a generic method employing the present microetchant formulation invention to intermediary manufacturing stages and the final fabrication step of a printed wiring board (PWB) having a Ni/Au plated edge connector, includes the steps of;

1) Fabricate a copper laminate on a dielectric substrate, examples of suitable dielectric substrates are given hereinabove, using a homogeneous copper foil preferably ½ ounce or less in thickness for internal circuit layers. For the purposes of definition and description: the dielectric substrate, if in the form of a film, will have an uppermost (and outermost) lateral surface that resides above the lowermost (and also outermost) lateral surface by the thickness of the film; additional layers coated on said uppermost lateral surface of said dielectric film will have associated with their coating, an uppermost and lowermost surface, said uppermost layer of said coating being furthest removed from said uppermost lateral surface of said dielectric film.

2) Drill and plate though-holes, drilling can be either mechanically performed or optically performed using a laser. Plating can be performed by either sputter, electroless or electrolytically.

3) Etch external circuits and commoning bar via standard subtractive processing methods, this step includes the application of a resist, followed by exposure, development, etch, and finally, strip the resist;

4) Apply a gold plating photoresist mask;

5) Expose and develop the photoresist to uncover copper tabs (features) to be Ni/Au plated;

6) Plate electrolytically Ni/Au on exposed copper tabs;

7) Strip photoresist;

8) Apply microetch formulation to clean boards;

9) Apply soldermask, then image, develop, and cure;

10) Microetch to clean copper surfaces and ENTEK process to produce copper oxide surfaces;

11) Profile cards from panel; and

12) Reclean with microetchant formulation as required. Steps 8), 10), and 12) involve cleaning with a microetchant formulation. If prior art persulfate/sulfuric acid microetchant is used significant bulk etching of the copper due to galvanic etching is observed. Replacement with the inventive formulation of sodium persulfate 100 gm/L, 3% phosphoric acid, and 0.058M sodium phosphate salt eliminates galvanic etching. Specifically contemplated as part of the present invention is the use of the inventive microetchant formulation during appropriate intermediary manufacturing steps 1–11 and final fabrication step, step 12.

Example 2

Manufacture of an embedded resistor PWB, involves the following steps:

1) Laminate copper and OHMEGA-PLY resistor/conductor (a copper/nickel laminate) foil to a dielectric material such as epoxy-glass, 2) Apply a resist, followed by exposing, developing the conductor/resistor pattern, 3) Etch the copper circuits in any typical etchant (e.g., cupric chloride, ferric chloride, ammoniacal etch, etc.), 4) Etch exposed nickel/phosphorous,NiP resistive element, in $CuSO_4$ etchant, 5) Strip the photoresist, 6) Apply a second photoresist expose and develop the resistor pattern, 7) Selectively etch copper, leaving the NiP resistor behind. This step may be performed in chrome-sulfuric, ammoniacal etch solutions or a persulfate/phosphoric acid/phosphate salt etchant disclosed in a co-pending, commonly owned, U.S. patent application: Ser. No. 09/165,957, filed Oct. 2, 1998 by Lauffer, et al., entitled Copper Etching Compositions, Processes, and Products Derived Therefrom, 8) Strip the photoresist, 9) Test the resistors, 10) Use the Shipley Chlorite process for multilayer lamination. All commercially available oxide or adhesion treatment chemistries include a copper microetch consisting of sodium persulfate/sulfuric acid as a first copper preparation step, 11) Perform multilayer lamination, 12) Composite drill, plate and etch, 13) Apply a protective coat/soldermask and process, and 14) Final test including shorts/opens and resistor values.

Parts fabricated using the above process had significant resistor value mean and tolerance shifts occur between steps 9 and 14, that was predominantly due to the copper microetch chemistry of step 10. OHMEGA-PLY 25 ohm/square material processed as above had resistor mean and tolerance shifts of approximately 1.2–1.3× between steps 9 and 14. OHMEGA-PLY 100 ohm/square material processed as above had resistor mean and tolerance shifts of approximately 4–5×between steps 9 and 14. Using the inventive microetch formulation containing 100 gm/liter sodium persulfate, 3 volume % phosphoric acid and 0.058 molar sodium phosphate, in step 10, effective removal of the copper oxide film and microetch of copper was obtained with no attack on the NiP resistor. In this case both OHMEGA-PLY 25 and 100 ohm/square materials had less than 5% resistor mean and less than 2% resistor tolerance shifts when processed with this chemistry.

Example 3

A process of manufacturing a printed wiring board having selectively plated nickel/gold features comprising the steps of:
 a) providing a dielectric substrate having at least one outermost lateral surface;
 b) fabricating a layer of copper to said at least one said outermost lateral surface of said dielectric substrate (fabrication can include such processes as sputtering, to lamination of copper foil, electroplating and electroless plating and the like);
 c) drilling through said copper layer and said dielectric substrate to form through-holes having vertical walls (drilling can include such processes as mechanical drilling using a bit or optical drilling such as with a laser);
 d) plating copper on said vertical walls of said through-holes and outermost copper surface of said laminated copper foil, creating a layer of plated copper having an outermost surface (plating can be performed by any of the processes described in step (b));
 e) applying a resist to said outermost surface of said plated copper (application of the resist can be performed by dipping, laminating, spraying or spinning and the like; the resist itself can be either in solid layer form or in liquid form, furthermore, the resist can be either negative working or positive working);
 f) exposing and developing said resist and etching uncovered plated copper and said underlying copper layer, thereby fabricating on said outermost surface of said dielectric substrate, multiple, independent external circuits and a commoning bar connected thereto, said external circuits and said commoning bar each having an outermost surface;
 g) stripping said developed resist;
 h) applying a plating photoresist mask to said outermost surfaces of said multiple, independent external circuits, said commoning bar and uncovered areas of said outermost surfaces of said dielectric substrate;
 i) exposing and developing said plating photoresist mask to uncover select copper features from said external circuits, said select copper features having outermost lateral and vertical side surfaces;
 j) plating nickel/gold on said uncovered outermost lateral and vertical side surfaces of said select copper features (the plating process can be any of the processes described in step (b));
 k) stripping said developed plating photoresist mask that was exposed and developed in step (i), uncovering unplated copper external circuits and portions of said uppermost surface of said dielectric substrate, and said uncovered plated through-holes;
 l) applying a microetch aqueous solution comprising an inorganic acid, a persulfate salt and a phosphate salt, to clean said unplated copper external circuits and said plated through-hole walls of in-process oxides and other contaminants from Step k,(tank processing which is used for oxide pre-cleans, or pre-plate cleaning operations are performed using microctchant solutions at about 80–90° F., and a dwell time from about 15 seconds to 2 minutes depending on the particular application, pre-oxide cleaning typically is performed with a 15 second dwell time);
 m) applying a solder mask to said outermost surfaces of said external circuits, said nickel/gold plated copper features, said plated through-holes and said commoning bar,
 n) imaging, developing, and curing said solder mask applied in step (m) to expose said plated through holes and outermost surfaces of said external circuits and nickel/gold plated copper features;
 o) reapplying said microetch aqueous solution comprising an inorganic acid, a persulfate salt and a phosphate salt, to clean in-process oxides and other contaminants (conveyorized spray processing for end of line cleaning prior to solderability preservative application can be performed at about 80–90° F. with a spray pressure of about 15–20 psi, and a dwell time of 20–30 seconds);
 p) applying an organic solderability preservative to said walls of said plated through-holes, said outermost surfaces of said external circuits, said nickel/gold plated copper features, and other said uncovered non-nickel gold plated copper features;
 q) separating said external circuitry from said commoning layer, creating individual printed wiring boards; and
 r) reapplying said microetch aqueous solution comprising an inorganic acid, a persulfate salt and a phosphate salt, to clean said individual printed wiring boards.

Example 4

A process to manufacture an embedded resistor printed wiring board, comprising the steps of:
 a) providing a dielectric substrate having at least one outermost lateral surface;
 b) providing a laminate copper/resistive foil, comprising a copper layer having an uppermost, smooth surface, and a lowermost, rough surface, and a nickel resistive layer having an uppermost and lowermost surface, said lowermost, rough copper surface and said uppermost nickel resistive surface being in intimate contact, the assembled laminate copper/resistive foil having an uppermost copper surface and a lowermost nickel resistive surface;
 c) laminating said lowermost nickel resistive surface of said laminate copper/resistive foil to said outermost lateral surface of said dielectric substrate;
 d) applying a first photoresist to said uppermost copper surface of said laminate copper/resistive foil;
 e) exposing and developing said first photoresist, thereby uncovering discrete areas of said uppermost surface of said laminate copper/resistive foil;
 f) etching in a subtractive process said discrete, uncovered areas of said copper layer, thereby fabricating copper fine line circuitry in covered areas, and uncovering said uppermost surface of said nickel resistive layer in said etched areas, said copper fine line circuitry having an uppermost surface and vertical side walls;
 g) etching said uncovered areas of said nickel resistive layer in electrical contact with said copper fine line circuitry using a copper sulfate/sulfuric acid etch solution;

h) stripping said developed first photoresist;

i) applying a second photoresist to the uppermost surface and vertical side walls of said copper fine line circuitry and said outermost dielectric substrate;

j) exposing and developing a resistor pattern into said second photoresist, uncovering second discrete areas of said uppermost surface of said laminate copper/resistive foil;

k) selectively etching copper from said second uncovered discrete areas of said laminate copper/resistive foil, while leaving underlying areas of said nickel resistive layer unaffected, thereby forming nickel resistive elements having uppermost and side wall surfaces;

l) stripping said developed second photoresist;

m) applying a microetch aqueous solution comprising an inorganic acid, a persulfate salt and a phosphate salt, to clean said copper fine line circuitry;

n) enhancing bond strength to subsequently applied dielectric materials by using a chlorite or copper oxide process for multilayer lamination, whereby copper oxide is formed on said uppermost surface and side walls of said copper fine line circuitry;

o) applying a second dielectric layer to the uppermost surface and side walls of said fine line copper circuits, to said uppermost surface and side walls of said nickel resistive elements, and to said uncovered outermost surface of said first dielectric substrate, wherein said second dielectric layer has an uppermost surface;

p) modifying said uppermost surface of said second dielectric layer to provide adhesion to subsequent fine line copper circuitry;

q) drilling and plating through-holes through said second dielectric layer;

r) fabricating fine line copper circuitry on said uppermost surface of said second dielectric layer by subtractive, semiadditive or additive processes; and s) connecting electrically fine line copper circuitry on said uppermost surface of said second dielectric layer to said fine line copper circuitry and said nickel resistive elements of said first dielectric substrate via said through-holes, forming a composite laminate having an embedded nickel resistor element.

Those skilled in the art would readily appreciate that all parameters listed herein are meant to be exemplary and that actual parameters will depend upon the specific application for which methods and apparatus of the present invention are used. It is therefore, to be understood that the foregoing embodiments are presented by way of example only and that, within the scope of the appended claims and equivalents thereto, the invention may be practiced otherwise than specifically described.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A process for cleaning copper surfaces of a copper clad printed wiring board (PWB) microelectronic package having an embedded resister, without etching bulk copper from said PWB, comprising contacting said surfaces of a PWB with an aqueous solution comprising an inorganic acid, a persulfate salt and a phosphate salt, and microetching, micropitting and roughening said surfaces said aqueous solution being formulated to avoid damaging said embedded resister.

2. The process as recited in claim 1, wherein PWBs comprise copper features on intermediary and final structures of a microelectronic package, said microelectronic package comprising a dielectric substrate having at least one lateral outermost surface to which said copper features are attached.

3. The process as recited in claim 1, wherein said phosphate salt is selected from the group consisting of orthophosphate, metaphosphate, hydrogenphosphate and dihydrogenphosphate salts.

4. The process as recited in claim 3, wherein the cation in said phosphate salt is selected from the group consisting of cations of: ammonium, potassium, sodium, lithium, and water soluble alkaline metal cations.

5. The process as recited in claim 1, wherein said inorganic acid is selected from the group consisting of sulfuric acid, phosphoric acid, metaphosphoric acid and pyrophoephoric acid.

6. The process as recited in claim 1, if wherein the cation in said persulfate salt is selected from the group consisting of alkali metals, ammonium and water soluble alkaline metal cations.

7. The process as recited in claim 1, wherein said aqueous solution comprises approximately 25–100 gm/liter sodium persulfate, up to about 3 volume % phosphoric acid, and up to about 0.116 Molar sodium phosphate.

8. The process au recited in claim 1, wherein said aqueous solution further comprises a surfactant.

9. The process as recited in claim 8, wherein said surfactant is anionic.

10. The process as recited in claim 9, wherein said anionic surfactant is selected from the group of compounds consisting of aryl sulfonates, alkyl sulfonates, aryl sulfates, alkyl sulfates and phosphate esters.

11. The process as recited in claim 8, wherein said surfactant is nonionic.

12. The process as recited in claim 11, wherein said nonionic surfactant is selected from the group of compounds consisting of nonyl phenol ethoxylated with 3–30 moles of ethylene oxide, octyl phenol ethoxylated with 3–30 moles of ethylene oxide, block copolymers of ethylene oxide and propylene oxide, and alkyl polyoxyalkylene ethers.

13. The process as recited in claim 2, wherein said copper features comprise at least one of the group consisting of plated through holes, contact fingers, tabs, connecting pads, and external and fine line circuitry.

14. The process as recited in claim 13, wherein said intermediary and final structures of said microelectronic package further comprise precious metal/nickel or phosphorous/nickel plated features, wherein said surfaces of unplated said copper features are proximate said precious metal/nickel or phosphorous/nickel plated features, wherein said copper surfaces are unaffected by galvanic or accelerated etching of bulk copper from said aqueous solution.

15. The process as recited in claim 14, wherein said precious metal is gold or palladium.

16. The process as recited in claim 2, wherein said intermediary and final structures of said microelectronic package comprise an embedded nickel resistor.

17. A process to manufacture an intermediate structure of an embedded resistor printed wiring board, comprising the steps of:

a) providing a printed wiring board (PWB) internal core comprising a dielectric substrate having at least one outermost lateral surface, copper features, and at least one nickel or nickel alloy planar resistor formed on said at least one of said outermost lateral surfaces; and b) applying a microetch solution comprising an inorganic acid, a persulfate salt and a phosphate salt, to clean exposed surfaces of said copper features, to micropit and to roughen said outermost lateral surface, said microetch solution being formulated to avoid adversely affecting the resistor values of or otherwise damaging said at least one nickel or nickel alloy planar resistor.

18. The process to manufacture an embedded resistor printed wiring board, as described in claim 17, wherein said first and second dielectric substrates are substrate is selected from the group consisting of epoxy resins, polyimides, polytetrafluoroethylene (TEFLON), cyanates, cyanate esters, BT epoxies, and IBM Driclad epoxy, either unreinforced or reinforced with glass.

19. A process to manufacture a planar resistor in an intermediate structure printed wiring board, comprising the steps of:

a) providing a printed wiring board internal core comprising a dielectric substrate having at least one lateral outer surface and first copper features affixed to said at least one of said lateral outer surfaces;

b) applying a microetch solution comprising an inorganic acid, a persulfate salt and a phosphate salt, to said first copper features in order to clean, to micropit and to roughen exposed surfaces of said first copper features;

c) enhancing bond strength to subsequently applied dielectric materials by forming copper oxide on uppermost and sidewall surfaces of said first copper features;

d) applying a dielectric material to the dielectric substrate to exposed said lateral outer surfaces of said dielectric substrate and to said first copper features in order to generate a multilayer laminate;

e) fabricating and plating through-holes through said dielectric material;

f) forming second copper features and at least one planar nickel or nickel alloy resistor on an uppermost surface of said dielectric material, said second copper features and said planar resistor being electrically connected to said first copper features through said plated through-holes; and g) applying a microetch solution comprising an inorganic acid, a persulfate salt and a phosphate salt to said second copper features in order to clean, to micropit and to roughen exposed surfaces of said second copper features, said microetch solution being formulated to avoid adversely affecting the resistor values of said at least one nickel or planar nickel alloy resistor.

20. A process of manufacturing intermediary structures of a microelectronic package, comprising the steps of:

a) providing a microelectronic package comprising a dielectric substrate, said dielectric substrate having an outermost lateral surface with at least one component selected from the group consisting of unplated copper features, precious metal plated copper features, and copper circuit lines attached thereto, said microelectronic package comprising an embedded microresistor;

b) applying an aqueous microetchant solution comprising inorganic acid, persulfate salt and phosphate salt, to said microelectronic package in order to clean, to micropit and to roughen said unplated copper features, without causing galvanic etching of bulk copper from said components;

c) applying and processing a soldermask material to uppermost surfaces of said components in order to expose said copper features, while protecting said copper circuit lines with unprocessed soldermask material;

d) reapplying said acqueous microetchant solution from step (b), to said copper features in order to clean, to micropit and to roughen in-process oxides and other contaminants without galvanic etching of bulk copper from said copper features; and e) applying an organic solderability preservative to said exposed unplated copper features to fabricate sites for mounting pads.

* * * * *